(12) United States Patent
Ghosh et al.

(10) Patent No.: US 11,508,611 B2
(45) Date of Patent: *Nov. 22, 2022

(54) ENHANCED LIFT PIN DESIGN TO ELIMINATE LOCAL THICKNESS NON-UNIFORMITY IN TEOS OXIDE FILMS

(71) Applicant: Applied Materials, Inc., Santa Clara, CA (US)

(72) Inventors: Kalyanjit Ghosh, Pleasanton, CA (US); Mayur G. Kulkarni, Bangalore (IN); Sanjeev Baluja, Campbell, CA (US); Praket P. Jha, San Jose, CA (US); Krishna Nittala, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 393 days.

This patent is subject to a terminal disclaimer.

(21) Appl. No.: 16/664,396

(22) Filed: Oct. 25, 2019

(65) Prior Publication Data

US 2020/0058538 A1 Feb. 20, 2020

Related U.S. Application Data

(63) Continuation of application No. 15/333,345, filed on Oct. 25, 2016, now Pat. No. 10,490,436.

(Continued)

(51) Int. Cl.
*H01L 21/687* (2006.01)
*C23C 16/458* (2006.01)

(52) U.S. Cl.
CPC .... *H01L 21/68742* (2013.01); *C23C 16/4581* (2013.01); *H01L 21/68757* (2013.01)

(58) Field of Classification Search
None
See application file for complete search history.

(56) References Cited

U.S. PATENT DOCUMENTS

| 5,457,075 A | 10/1995 | Fukushima et al. |
| 7,126,090 B2 | 10/2006 | Yamaguchi et al. |

(Continued)

FOREIGN PATENT DOCUMENTS

| CN | 101515115 A | 8/2009 |
| CN | 101878323 A | 11/2010 |

(Continued)

OTHER PUBLICATIONS

International Search Report and Written Opinion for International Application No. PCT/US2016/053970 (APPM/023252PCT) dated Jan. 11, 2017.

(Continued)

*Primary Examiner* — Jeffrie R Lund
*Assistant Examiner* — Tiffany Z Nuckols
(74) *Attorney, Agent, or Firm* — Patterson + Sheridan, LLP

(57) ABSTRACT

Implementations disclosed herein generally provide a lift pin that can improve the deposition rate and uniform film thickness above lift pin areas. In one implementation, the lift pin includes a first end coupling to a shaft, the first end having a pin head, and the pin head having a top surface, wherein the top surface is planar and flat, and a second end coupling to the shaft, the second end having a flared portion, wherein the flared portion has an outer surface extended along a direction that is at an angle of about 110° to about 140° with respect to a longitudinal axis of the lift pin.

20 Claims, 4 Drawing Sheets

Related U.S. Application Data

(60) Provisional application No. 62/250,740, filed on Nov. 4, 2015.

(56) References Cited

U.S. PATENT DOCUMENTS

| | | |
|---|---|---|
| 2003/0183615 A1 | 10/2003 | Yamaguchi et al. |
| 2004/0241992 A1 | 12/2004 | Kono et al. |
| 2006/0017005 A1 | 1/2006 | Kim |
| 2006/0156981 A1 | 7/2006 | Fondurulia et al. |
| 2007/0160507 A1 | 7/2007 | Satoh et al. |
| 2007/0217114 A1 | 9/2007 | Sasaki et al. |
| 2009/0314211 A1 | 12/2009 | Du Bois et al. |
| 2010/0086784 A1 | 4/2010 | Patalay et al. |
| 2011/0056436 A1 | 3/2011 | Van Munster et al. |

FOREIGN PATENT DOCUMENTS

| | | |
|---|---|---|
| CN | 102077339 A | 5/2011 |
| CN | 203999810 U | 12/2014 |

OTHER PUBLICATIONS

CN Office Action for Chinese Application No. 201610972233.7 dated Jul. 20, 2022.

ENHANCED LIFT PIN DESIGN TO ELIMINATE LOCAL THICKNESS NON-UNIFORMITY IN TEOS OXIDE FILMS

CROSS-REFERENCE TO RELATED APPLICATIONS

This application is a continuation application of U.S. patent application Ser. No. 15/333,345, filed Oct. 25, 2016, which claims benefit of U.S. Provisional Patent Application Ser. No. 62/250,740, filed Nov. 4, 2015 which are herein incorporated by reference in their entirety,

FIELD

Implementations of the present disclosure generally relate to an improved lift pin for positioning a substrate relative to a substrate support.

BACKGROUND

Integrated circuits have evolved into complex devices that include millions of transistors, capacitors and resistors on a single chip. The evolution of chip design results in faster circuitry and greater circuit density. As the demand for integrated circuits continues to rise, chip manufactures have demanded semiconductor process tooling having increased wafer throughput, greater product yield, and more robust processing equipment. To meet demands, tooling is being developed to minimize wafer handoff errors, reduce particle contamination, and increase the service life of tool components.

Lift pins are typically used in the semiconductor process tooling, such as a processing chamber, to support a substrate. The lift pins generally reside in guide holes disposed through the substrate support disposed within the processing chamber. The upper ends of the lift pins are typically flared to prevent the pins from passing through the guide holes. The lower ends of the lift pins extend below the substrate support and are actuated by a lift plate that contacts the pins at their lower ends. The lift plate is movable in a vertical direction between upper and lower positions. In the upper position, the lift plate moves the lift pins through the guide holes formed through the substrate support to extend the flared ends of the lift pins above the substrate support, thereby lifting the substrate into a spaced apart relation relative to the substrate support to facilitate substrate transfer.

It has been observed that current lift pin designs would cause high temperature spots (hot spots) on the substrate surface at regions where the lift pins are located. Hot spots on substrate may occur due to the absence of direct substrate support in the guide hole areas, which results in a larger gap between the substrate and lift pin and thus reduces dissipation of radiation heat coming from plasma. Radiation heat from plasma also increases lift pin temperature that causes hot spots on the substrate surface. These hot spots negatively affect the deposition rate localized above the lift pins. As a result, the uniformity of film thickness is suffered.

Therefore, there is a need in the art for an improved lift pin assembly.

SUMMARY

Implementations described herein generally relate to a lift pin assembly for supporting a substrate. In one implementation, a lift pin for positioning a substrate relative to a substrate support is provided. The lift pin includes a first end coupling to a shaft, the first end having a pin head, and the pin head having a top surface, wherein the top surface is planar and flat, and a second end coupling to the shaft, the second end having a flared portion, wherein the flared portion has an outer surface extended along a direction that is at an angle of about 110° to about 140° with respect to a longitudinal axis of the lift pin.

In another implementation, the lift pin includes a first end coupling to a shaft, the first end having a pin head disposed at the first end, the pin head having a planar surface, a second end coupling to the shaft, the second end having a flared portion, wherein the flared portion has an outer surface extended along a direction that is at an angle of about 120° to about 135° with respect to a longitudinal axis of the lift pin, and a shoulder disposed at the second end, wherein the shoulder has a diameter greater than a diameter of the shaft and the shoulder has a through-hole.

In yet another implementation, a substrate support assembly for processing a substrate is provided. The substrate support comprises a lift pin assembly, comprising a first end coupling to a shaft and a second end coupling to the shaft, the first end comprising a pin head having a top surface, wherein the top surface is planar and flat, and a flared portion coupling the pin head to the shaft, the flared portion has an outer surface extended along a direction that is at an angle of about 110° to about 140° with respect to a longitudinal axis of the lift pin, and a substrate support, having a plurality of guide holes disposed therethrough, each guide hole for accommodating a lift pin of the lift pin assembly, a lift plate, and an actuator for controlling the elevation of the lift plate, wherein the distance between the top surface of the pin head and a bottom surface of a substrate to be disposed on the substrate support during process is less than about 10 mils.

BRIEF DESCRIPTION OF THE DRAWINGS

Implementations of the present disclosure, briefly summarized above and discussed in greater detail below, can be understood by reference to the illustrative implementations of the disclosure depicted in the appended drawings. It is to be noted, however, that the appended drawings illustrate only typical implementations of this disclosure and are therefore not to be considered limiting of its scope, for the disclosure may admit to other equally effective implementations.

To facilitate understanding, identical reference numerals have been used, where possible, to designate identical elements that are common to the figures. The figures are not drawn to scale and may be simplified for clarity. It is contemplated that elements and features of one implementation may be beneficially incorporated in other implementations without further recitation.

DETAILED DESCRIPTION

Implementations described herein generally provide an apparatus for processing a semiconductor substrate. The implementations described herein are illustratively utilized in a processing system, such as a CVD processing system, available from Applied Materials, Inc., of Santa Clara, Calif. However, it should be understood that the implementations described herein may be incorporated into other chamber configurations such as physical vapor deposition chambers, etch chambers, ion implant chambers, and other semiconductor processing chambers. Details of the disclosure and various implementations are discussed below.

Figure 1:
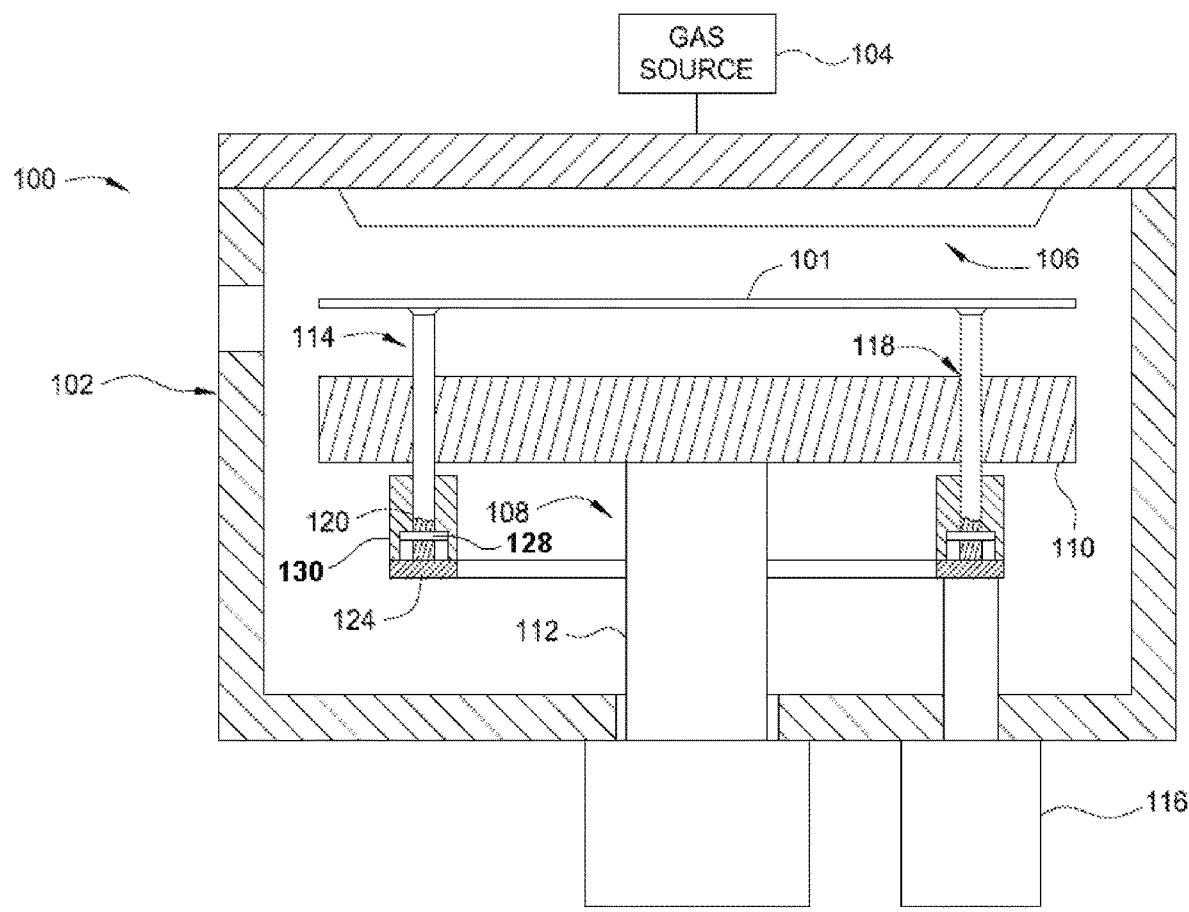
FIG. 1 is a cross-sectional view of a deposition chamber with a lift pin assembly according to one implementation of the present disclosure.

FIG. 1 depicts a cross sectional view of a processing system 100. The system 100 generally comprises a chamber body 102 coupled to a gas source 104. The chamber body 102 is typically a unitary, machined structure fabricated from a rigid block of material such as aluminum. Within the chamber body 102 is a showerhead 106 and a substrate support assembly 108. The showerhead 106 is coupled to the upper surface or lid of the chamber body 102 and provides a uniform flow of gas from the gas source 104 that is dispersed over a substrate 101 positioned on a substrate support assembly 108.

The substrate support assembly 108 generally comprises a substrate support 110 and a stem 112. The stem 112 positions the substrate support 110 within the chamber body 102. The substrate 101 is placed upon the substrate support 110 during processing. The substrate support 110 may be a susceptor, a heater, an electrostatic chuck or a vacuum chuck. Typically, the substrate support 110 is fabricated from a material selected from ceramic, aluminum, stainless steel, and combinations thereof. The substrate support 110 has a plurality of guide holes 118 disposed therethrough, each guide hole 118 accommodating a lift pin 120 of a lift pin assembly 114.

The lift pin assembly 114 interacts with the substrate support 110 to position the substrate 101 relative to the substrate support 110. The lift pin assembly 114 typically includes the lift pins 120, a lift plate 124 and an actuator 116 for controlling the elevation of the lift plate 124. The elevation of the lift plate 124 is controlled by the actuator 116. The actuator 116 may be a pneumatic cylinder, hydraulic cylinder, lead screw, solenoid, stepper motor, or other motion device that is typically positioned outside of the chamber body 102 and adapted to move the lift plate 124. As the lift plate 124 is moved towards the substrate support 110, the lift plate 124 contacts the lower ends of the lift pins 120 to move the lift pins 120 through the substrate support 110. The upper ends of the lift pins 120 move away from the substrate support 110 and lift the substrate 101 into a spaced-apart relation relative to the substrate support 110.

The plurality of lift pins 120 are disposed axially through the lift pin guide holes 118 formed through the substrate support 110. The guide holes 118 may be integrally formed in the substrate support 110, or may alternatively be defined by an inner passage of a guide bushing (not shown) disposed in the substrate support 110. The lift pin 120 is typically comprised of ceramic, stainless steel, aluminum, aluminum nitride, aluminum oxide, or other suitable material. In one implementation, the lift pin 120 is comprised of aluminum nitride (AlN). Lift pins made out of AlN improves lift pin thermal dissipation capacity due to its higher thermal conductivity. If desired, the lift pins 120 may be AlN containing yttrium oxide ($Y_2O_3$) of about 2 wt % to about 5 wt % to further enhance the thermal conductivity. A cylindrical outer surface of the lift pin 120 may additionally be treated to reduce friction and surface wear. For example, the cylindrical outer surface of the lift pin 120 may be plated, plasma flame sprayed, or electropolished to reduce friction, alter the surface hardness, improve smoothness, or improve resistance to scratching and corrosion.

Figure 2A:
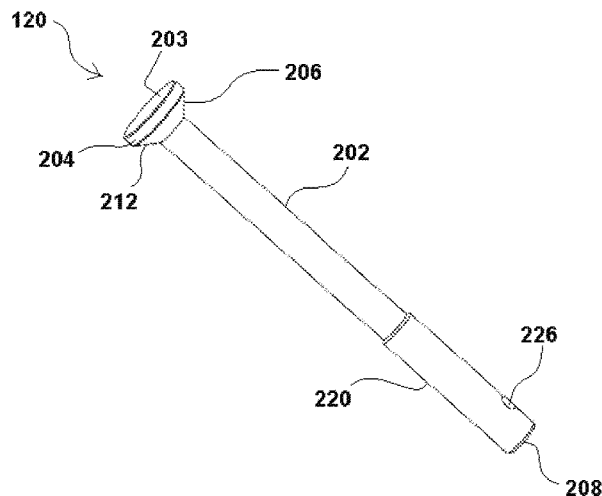
FIG. 2A is a perspective view of a lift pin according to one implementation of the present disclosure.
Figure 2B:
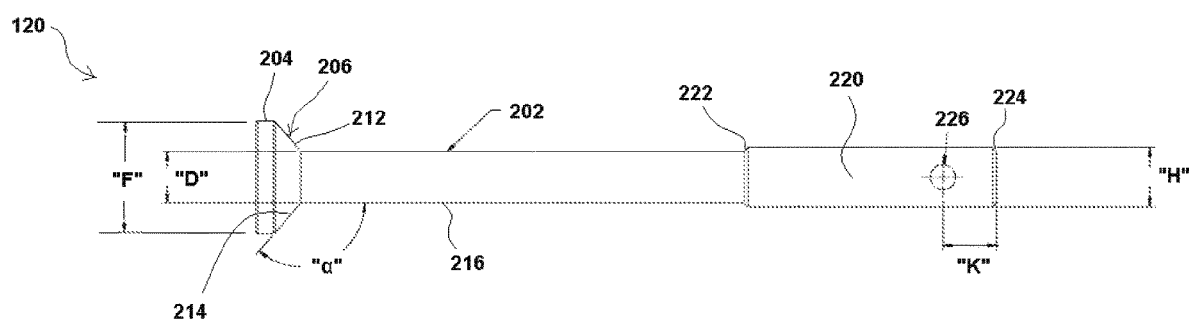
FIG. 2B is a side view of a lift pin according to one implementation of the present disclosure.
Figure 2C:
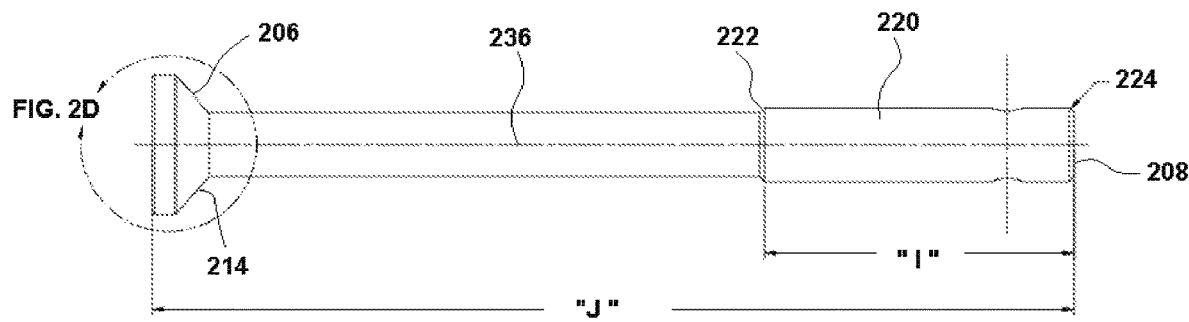
FIG. 2C is a side view of a lift pin according to one implementation of the present disclosure.
Figure 2D:
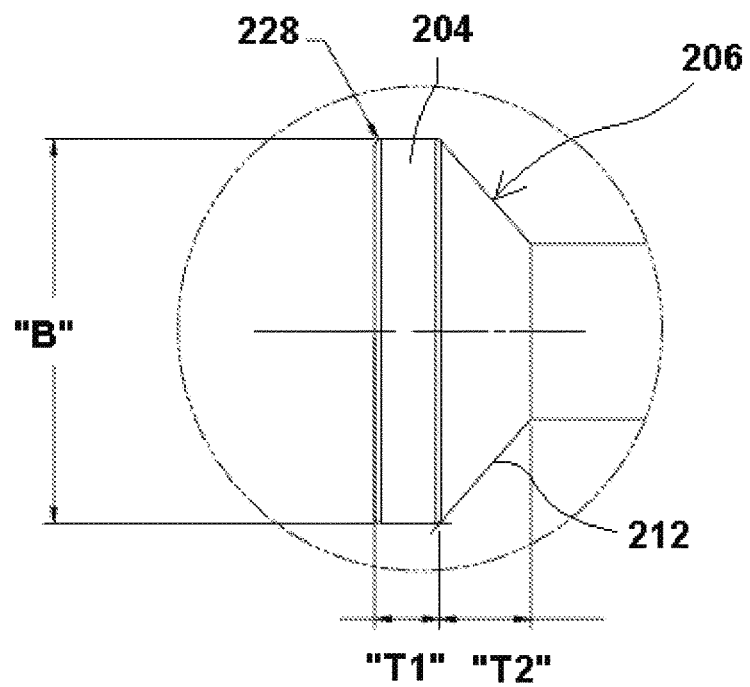
FIG. 2D is an enlarged perspective view of one implementation of the pin head of FIG. 2C.

FIG. 2A is a perspective view of a lift pin 120 according to one implementation of the present disclosure. FIG. 2B is a side view of a lift pin 120 according to one implementation of the present disclosure. FIG. 2C is yet another side view of a lift pin 120 according to one implementation of the present disclosure. FIG. 2D is an enlarged perspective view of one implementation of the pin head 204 of FIG. 2C.

Referring to 2A, the lift pin 120 comprises a shaft 202 coupled with a first end 206 and a second end 208. The first end 206 of the lift pin 120 comprises a pin head 204 and a flared portion 212. The pin head 204 is the end portion of the shaft 202 to be in contact with a bottom surface of the substrate 101. The pin head 204 serves as a heat-transferring interface. The flared portion 212 couples the pin head 204 to the shaft 202. The flared portion 212 of the lift pin 120 is sized to prevent the lift pin 120 from falling through the guide hole 118 disposed through the substrate support 110 (see FIG. 1) with a force of gravity. The guide hole 118 may be countersinks configured to allow the first end 206 to be positioned flush with or slightly recessed from the substrate support 110 when the pin 120 is in a normal position (i.e., retracted relative to the substrate support 110). In one implementation, the top surface 203 of the first end 206 is planar and flat (i.e., oriented perpendicular to a longitudinal axis 236 of the lift pin 120).

The top surface 203 may optionally have a rounded corner 228 at the peripheral edge of the top surface 203 (see FIG. 2D). The diameter "B" of the pin head 204 is dimensioned to fit within the guide hole 118. It is contemplated that the size or diameter of the top surface 203 can be adjusted such that a desired amount of heat can be uniformly transferred to the substrate to avoid the presence of hot spots and cold spots on the substrate surface.

It has been observed that the substrate may detrimentally slide on the pin head 204 during thermal cycling, which increases mechanical stress and potentially induces slip of the substrate. Therefore, in some implementations, the top surface 203 of the first end 206 may be treated to have a surface finish or roughness of about 1.0 microns or less, for example about 0.4 microns to about 0.6 microns, to reduce substrate sliding.

Figure 3:
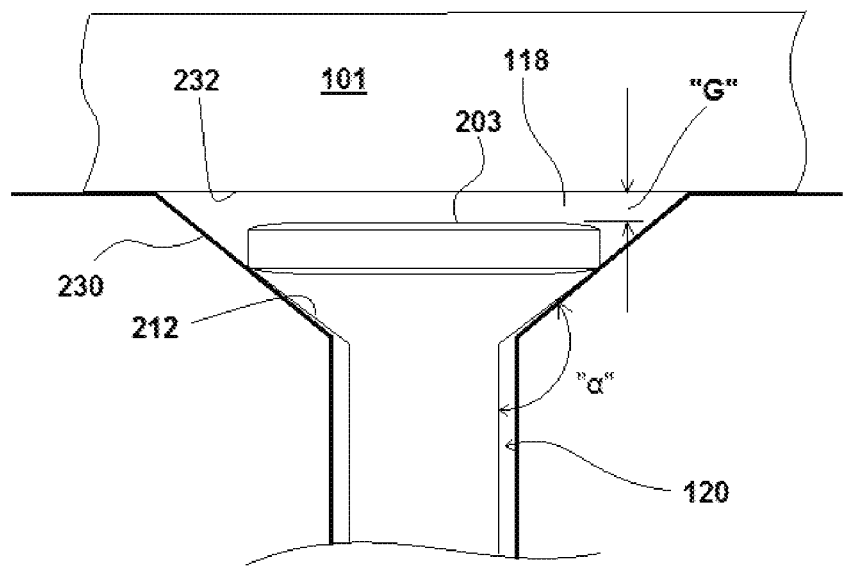
FIG. 3 is a partial view of a substrate support showing the distance "G" between the substrate and the lift pin.

The flared portion 212 has an outer surface 214 extended along a direction that is at an angle "α" with respect to an outer surface 216 of the shaft 202. The outer surface 216 of the shaft 202 is in parallel to a longitudinal axis 236 (see FIG. 2C) of the lift pin 120. In one implementation, the angle "α" is about 110° to about 140°, such as about 120° to about 135°, for example about 130° to about 131°. Varying the angle "α" can effectively control the distance "G" between the substrate 101 and the lift pin 120, as can be seen in FIG. 3. This is because the first end 206 of the lift pin 120 sits on the peripheral inner wall 230 within the guide hole 118 and the slope of the inner wall 230 is fixed, so the distance "G" between the bottom 232 of the substrate 101 and the top surface 203 of the first end 206 of the lift pin 120 can be adjusted by increasing or decreasing the angle "α".

In various implementations of this disclosure, the distance "G" is controlled below 10 mils or less, for example about 9 mils or less. It is contemplated that the distance "G" may be controlled ranging from about 0.001 mils to about 21 mils, such as about 0.002 mils to about 18 mils, for example about 2 mils to about 8.5 mils. In one exemplary aspect, the distance "G" is between about 3 mils to about 6.2 mils. Additionally or alternatively, the slope of the inner wall 230 may also be adjusted to vary the distance "G" between the substrate 101 and the lift pin 120. Reduce distance "G" increases heat dissipation between the substrate 101 and the lift pin 120, which help minimize "hot spots" on the substrate surface and thus increases the deposition rate and film uniformity above the lift pin areas.

The second end 208 of the lift pin 120 extends beyond the underside of the substrate support 110 and is adapted be urged by the lift plate 124 to extend the first end 206 of the lift pin 120 above the substrate support 110. The second end 208 may be rounded, flat or have another shape. In one implementation, the second end 208 is planar and flat (i.e., oriented perpendicular to the center line of the lift pin 120).

Referring to FIG. 2B, the shaft 202 has a diameter "D". The second end 208 of the lift pin 120 may include a shoulder 220 having a diameter "H," wherein the diameter "H" is greater than the diameter "G" of the shaft 202. The lift pin head 204 has a diameter "F" greater than the diameter "D" of the shaft 202. The shoulder 220 includes two opposing tapered ends 222 and 224. The tapered end 222 transitions the shoulder 220 with the shaft 202. The shoulder 220 has a through-hole 226 dimensioned to accommodate a locking pin 128, which couples a foot mechanism 130 (see FIG. 1) with the lift pin 120. The foot mechanism 130 stands the lift pin 120 on the lift plate 124 and allows for easy centering of the lift pin 120 within the lift pin guide hole 118, thereby reducing the likelihood that the lift pin 120 will tilt or lean in the guide hole 118. In one implementation shown in FIG. 2C, the length "I" of the shoulder 220 is approximately ⅓ of the total length "J" of the lift pin 120. In one implementation, the distance "K" from the center of the through-hole 226 to the second end 208 of the lift pin is approximately ¼ the length "I" of the shoulder 220. The lift pin 204 has a thickness "T1" and the flared portion 212 has a thickness "T2". The thickness "T2" is relatively larger than the thickness "T1".

Figure 2E:
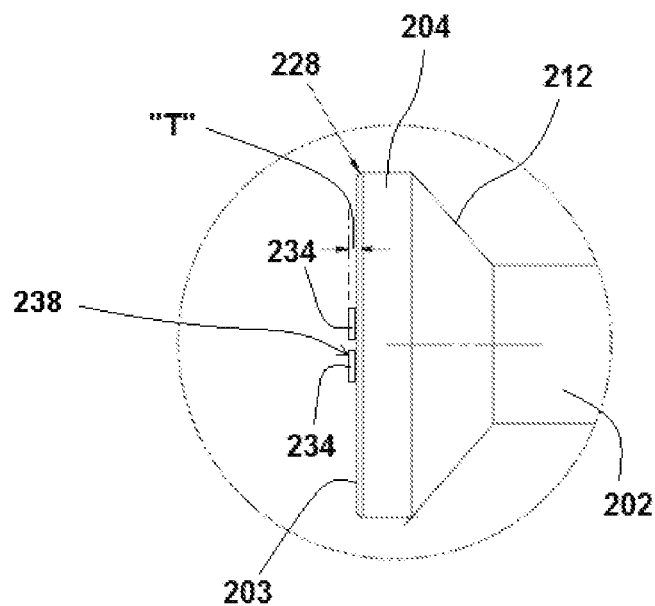
FIG. 2E is an enlarged perspective view of another implementation of the pin head of FIG. 2C.

FIG. 2E is an enlarged perspective view of another implementation of the pin head 204 of FIG. 2C. The first end 206 of the lift pin in this implementation is substantially identical to the implementation shown in FIG. 2B except that one or more projections 234 are provided on the top surface 203 of the pin head 204 to further reduce the distance "G" between the substrate 101 and the lift pin 120. The projections 234 may be any suitable shape such as rectangular, rhombus, square, hemispherical, hexagonal, triangular protrusions or mixtures of differently shaped protrusions. In one example as shown, the projections 234 are square-shaped projections disposed at the center region of the top surface 203. The projections 234 may have a diameter of about 0.03 to about 0.6 inches and a height "T" of about 0.002 inches. The height of the projections 234 is configured such that the distance "G" between the bottom 232 of the substrate 101 and the upper surface 238 of the projections 234 (see FIG. 3) is about 2 mils to about 8.5 mils, while the distance "G" between the bottom 232 of the substrate 101 and the top surface 203 where no projections 234 are presented is about 4 mils to about 11 mils.

Benefits of the present disclosure include an improved deposition rate and uniform film thickness above lift pin areas by reducing the distance between the lift pins and the substrate. The top surface of the lift pins is made planar and flat (i.e., oriented perpendicular to the center line of the lift pin), and the outer surface of the flared portion of the lift pins is extended along a direction that is at an angle with respect to an outer surface the pin shaft such that the distance between the lift pins and the substrate is less than about 10 mils, for example about 6 mils or less. Additionally, the lift pins are comprised of a material with higher thermal conductivity such as aluminum nitride to improve lift pin thermal dissipation capacity between the substrate and the lift pins, which minimizes "hot spots" on the substrate surface and thus increases the deposition rate and film uniformity above the lift pin areas.

While the foregoing is directed to implementations of the present disclosure, other and further implementations of the disclosure may be devised without departing from the basic scope thereof.

The invention claimed is:

1. A lift pin for positioning a substrate relative to a substrate support, the lift pin comprising:
   a shaft;
   a first end of the shaft having a pin head and a flared portion, the pin head having a top surface with a plurality of projections disposed at a center region thereof, each of the projections having a height of about 0.002 inches, and the flared portion having an outer surface extended along a direction that is at an angle of about 110° to about 140° with respect to a longitudinal axis of the life pin; and
   a second end of the shaft opposite the first end, the second end having a shoulder, the shoulder having opposing tapered ends.

2. The lift pin of claim 1, wherein each of the projections has a diameter of about 0.03 inches to about 0.6 inches.

3. The lift pin of claim 1, wherein a first tapered end of the opposing tapered ends transitions the shaft to the shoulder and the shoulder has a length approximately ⅓ of a length of the lift pin.

4. The lift pin of claim 3, wherein the first tapered end is opposite the flared portion of the first end.

5. The lift pin of claim 4, wherein each of the plurality of projections has a shape of rectangular, rhombus, square, hemispherical-shaped, hexagonal, or triangular.

6. The lift pin of claim 4, wherein the top surface has a rounded corner at a peripheral edge of the top surface.

7. The lift pin of claim 4, wherein the lift pin comprises aluminum nitride.

8. The lift pin of claim 4, wherein the lift pin comprises aluminum oxide.

9. The lift pin of claim 4, wherein the lift pin is fabricated from AlN containing yttrium oxide of about 2 wt % to about 5 wt %.

10. A lift pin for positioning a substrate relative to a substrate support, the lift pin comprising:
    a shaft;
    a first end of the shaft having a pin head and a flared portion, the pin head having a top surface with a plurality of projections disposed at a center region thereof, each of the projections having a height of about 0.002 inches;
    a second end of the shaft opposite the first end, the second end having a shoulder, the shoulder having a diameter greater than a diameter of the shaft and a length approximately ⅓ of a length of the lift pin; and
    a through-hole formed through the shoulder.

11. The lift pin of claim 10, wherein the flared portion has an outer surface extended along a direction that is at an angle of about 110° to about 140° with respect to a longitudinal axis of the lift pin.

12. The lift pin of claim 10, wherein the lift pin is fabricated from AlN containing yttrium oxide of about 2 wt % to about 5 wt %.

13. The lift pin of claim 10, wherein each of the plurality of projections is a rectangle, rhombus, square, hemisphere, hexagon, or triangle.

14. The lift pin of claim 13, wherein the lift pin comprises aluminum nitride.

15. The lift pin of claim 13, wherein the lift pin comprises aluminum oxide.

16. A substrate support assembly for processing a substrate, comprising:
   a lift pin assembly, comprising:
      a first end coupling to a shaft and a second end coupling to the shaft, the first end comprising:
         a pin head having a top surface that is planar, wherein the top surface further comprises a plurality of projections having a height of less than about 10 mils; and
         a flared portion coupling the pin head to the shaft, the flared portion has an outer surface extended along a direction that is at an angle of about 110° to about 140° with respect to a longitudinal axis of the lift pin; and
   a substrate support, having a plurality of guide holes disposed therethrough, each guide hole for accommodating a lift pin of the lift pin assembly;
   a lift plate; and
   an actuator for controlling an elevation of the lift plate.

17. The substrate support assembly of claim 16, wherein the lift pin comprises aluminum nitride.

18. The substrate support assembly of claim 16, wherein the lift pin comprises aluminum oxide.

19. The substrate support assembly of claim 16, wherein each of the plurality of projections having a shape of rectangular, rhombus, square, hemispherical, hexagonal, or triangular.

20. The substrate support assembly of claim 19, wherein a distance between an upper surface of at least one of the plurality of projections and a bottom surface of a substrate to be disposed on the substrate support during process is less than about 10 mils.

* * * * *